United States Patent [19]

Hansen

[11] Patent Number: 5,548,488
[45] Date of Patent: Aug. 20, 1996

[54] ELECTRICAL COMPONET MOUNTING SYSTEM

[75] Inventor: Scott A. Hansen, Holland, Mich.

[73] Assignee: Prince Corporation, Holland, Mich.

[21] Appl. No.: 415,699

[22] Filed: Apr. 3, 1995

[51] Int. Cl.⁶ ........................................... H05K 5/02
[52] U.S. Cl. ................ 361/815; 361/796; 361/801
[58] Field of Search .................... 361/815, 752, 361/796, 754, 759, 798, 801, 802; 29/845; 174/138 G, 52 R, 61, 59; 439/66, 67, 74, 77, 82, 493; 257/678; 248/221.3

[56] References Cited

U.S. PATENT DOCUMENTS

| | | |
|---|---|---|
| 4,347,552 | 8/1982 | Pearcy et al. . |
| 4,536,826 | 8/1985 | Ahiskali . |
| 4,613,925 | 9/1986 | Mohri et al. . |
| 4,618,915 | 10/1986 | Bury ........................................ 361/400 |
| 4,621,305 | 11/1986 | Daum . |
| 4,704,090 | 11/1987 | Marshall . |
| 4,740,162 | 4/1988 | Marshall . |
| 4,951,176 | 8/1990 | Bergfried et al. . |
| 4,953,061 | 8/1990 | Nitkiewicz . |
| 4,970,624 | 11/1990 | Arneson et al. . |
| 5,091,831 | 2/1992 | Van Order et al. . |
| 5,117,330 | 5/1992 | Miazga ..................................... 361/400 |
| 5,205,635 | 4/1993 | Van Order et al. . |
| 5,219,293 | 6/1993 | Imamura . |
| 5,309,634 | 5/1994 | Van Order et al. . |

*Primary Examiner*—Gerald P. Tolin
*Assistant Examiner*—Y. Whang
*Attorney, Agent, or Firm*—Price, Heneveld, Cooper, DeWitt & Litton

[57] ABSTRACT

An electrical component mounting system includes a substantially rigid substrate supporting a flexible circuit having a contact terminal with at least one aperture to receive a connecting pin from an electrical component. The aperture has a diameter slightly smaller than the diameter of the component conductor pin, such that extending the pin through the aperture in the flexible circuit deforms the contact terminal into an aligned larger diameter aperture in the substrate to provide a secure electrical connection between the pin and the terminal of the flexible circuit. In one embodiment of the invention, the conductive pin includes a locking groove for lockably engaging the rigid substrate.

21 Claims, 3 Drawing Sheets

5,548,488

ELECTRICAL COMPONET MOUNTING SYSTEM

BACKGROUND OF THE INVENTION

The present invention relates to an electrical component mounting system and one particularly useful for mounting components in a vehicle, such as an automobile.

Automotive electrical components, such as bulbs, fuses and the like, typically are mounted in electrical sockets which are mechanically and electrically affixed either to conventional electrical circuit boards or to other insulative substrates, such as lamp housings or in the case of fuses a fuse block assembly. Some of the mounting sockets employ insulation displacement connectors for directly attaching the sockets to electrical wiring harnesses, such as disclosed in U.S. Pat. No. 5,309,634. Other mounting arrangements for bulbs may include the utilization of a socket which compressively engages conductors on a printed circuit board as, for example, disclosed in U.S. Pat. No. 5,205,635. Further, electrical circuits for receiving replaceable components may themselves define the socket for receiving the bulb as, for example, shown in U.S. Pat. No. 5,091,831. Stamped electrical circuits also have been used, particularly with illuminated vanity visor packages in which stamped electrical circuit conductors are terminated in bulb receiving sockets formed by the end of the conductors themselves.

Although these various mounting systems all have their advantages, the underlying circuit construction is typically specifically made for a particular component typically requiring soldering the sockets to an existing circuit board or somehow forming the electrical circuit to define the sockets themselves. There remains a need, therefore, for an electrical circuit for use particularly in a vehicle, such as an automobile, which has the flexibility of receiving sockets for a variety of components such as fuses, lamps and other electrical components which can either be mounted in plug-in sockets which cooperate with the circuit board or by other coupling means which allows the easy replacement of such circuit components.

SUMMARY OF THE PRESENT INVENTION

The system of the present invention provides such a circuit mounting component system by providing a rigid substrate to which a flexible electrical circuit can be attached and which cooperates with the substrate to provide mechanical support for the flexible circuit for receiving components. The substrate may be in the form of a lamp housing or other mechanical component of a vehicle while the flexible circuit can extend from the lamp housing to other areas of the vehicle with sockets being located where desired.

In a preferred embodiment of the invention, the electrical component mounting system includes a substrate supporting a flexible circuit having a contact terminal having at least one aperture to receive a connecting pin from an electrical component. The aperture formed therein preferably has a diameter slightly smaller than the diameter of the component conductor pin, such that extending the pin through said aperture in the flexible circuit deforms the contact terminal into an aligned larger diameter aperture in the substrate to provide a secure electrical connection between the pin and the terminal of the flexible circuit.

In a preferred embodiment of the invention, the flexible circuit may include several interconnected islands with electrical sockets formed therein to interconnect a variety of electrical components at different areas of the vehicle. The flexible circuit thus serves also as a ribbon connector interconnecting such electrical components.

In one embodiment of the invention, the conductive pin includes a locking groove lockably engaging the substrate. Embodiments of the invention include mounting of electrical components, such as sockets, switches or fuse blocks. In one embodiment of the invention, the electrical mounting system defines a fuse which, if blown, can be replaced by a plug-in, cartridge-type fuse. These and other features, objects and advantages of the present invention will become apparent upon reading the following description thereof together with reference to the accompanying drawings.

DETAILED DESCRIPTION OF THE PREFERRED EMBODIMENT

Figure 1:
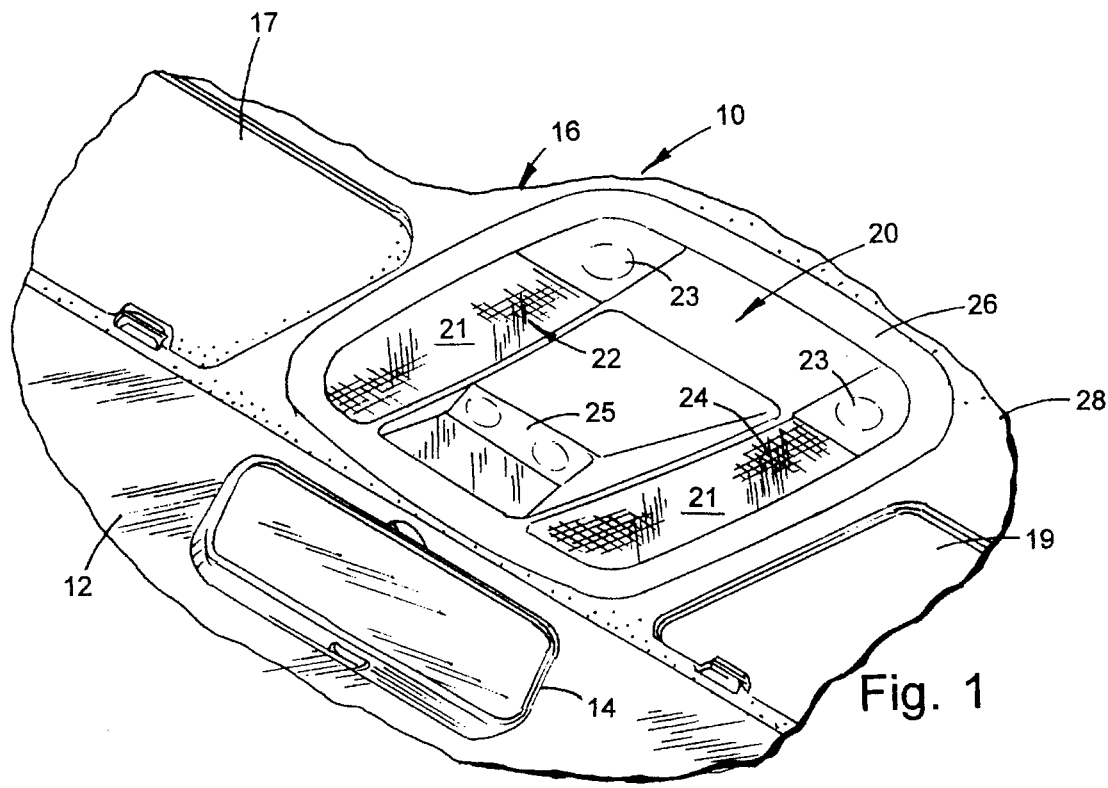
FIG. 1 is a perspective view of a vehicle showing a lamp assembly embodying the circuit mounting structure of the present invention.

Referring initially to FIG. 1, there is shown a vehicle 10, such as an automobile, and particularly the front area which shows a windshield 12 to which there is mounted a rearview mirror assembly 14. Mounted to the roof 16 above the rearview mirror assembly is a modular console 20 including map lamp assemblies 22 and 24 at either side of an integrated garage door opening transmitter 25, all being mounted in a housing 26 secured to the roof 16 of the vehicle. The roof is covered by a welded headliner 28 which can be premolded for a particular vehicle in a conventional manner. Console 20 may be attached directly to the headliner or alternatively include fastening means which extend through the headliner to the underlying sheet metal roof for the mounting of the console to the vehicle.

The vehicle also includes a pair of visors 17 and 19 for the driver and passenger sides, respectively. Each of the lamp assemblies 22, 24 include an electrical lamp positioned behind a lens 21 and electrical switch 23 for selectively providing operating power to the lamps through the vehicles electrical system. The lamps are mounted to the electrical circuit by the component mounting system embodying the present invention as now described initially in connection with FIG. 2.

Figure 2:
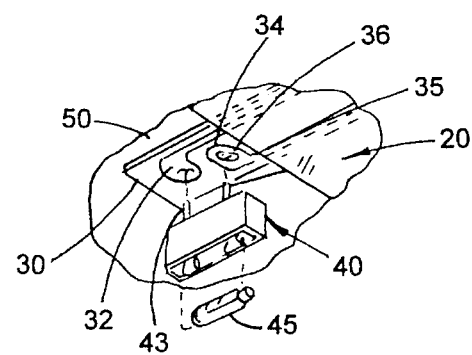
FIG. 2 is an enlarged, fragmentary, perspective and partially exploded view of a lamp incorporated in the assembly of FIG. 1.

Referring initially to FIG. 2, there is shown a portion of console 20 with lens 21 removed disclosing an underlying mylar film flexible circuit substrate 30 on which there is formed a conductive circuit pattern 32 terminating in at least a pair of terminals 34 and 36. Terminals 34 and 36 each have an aperture 35 formed therein, as described in greater detail below, for receiving conductive pins 41 and 43 of a lamp socket 40. Socket 40, in turn, includes spring contacts for receiving a cartridge-type lamp 45. The flexible substrate 30 is secured to a rigid substrate 50 which can be the floor of the console housing 26 in some embodiments or may otherwise be a rigid insulative material to which the flexible circuit substrate 30 is attached. For such purpose, the rigid substrate 50 will include apertures, as described below, which align with apertures 35 and the terminals 34 and 36 for lockably receiving socket 40 therein.

The flexible mylar circuit substrate 30 can extend from one of the lamp assemblies 22 through the area of switch 23 for receiving a switch therein across the console 20 and to the other lamp assembly 24 and its associated switch 23. The flexible substrate and its conductors also may define a ribbon for extending to other components of the vehicle for intercoupling vehicle accessories to one another as well as to the vehicle's operating power or signal systems. An example of a combined switch and lamp assembly, such as used in console 20, is shown in detail in FIGS. 3–5, which are now described.

Figure 3:
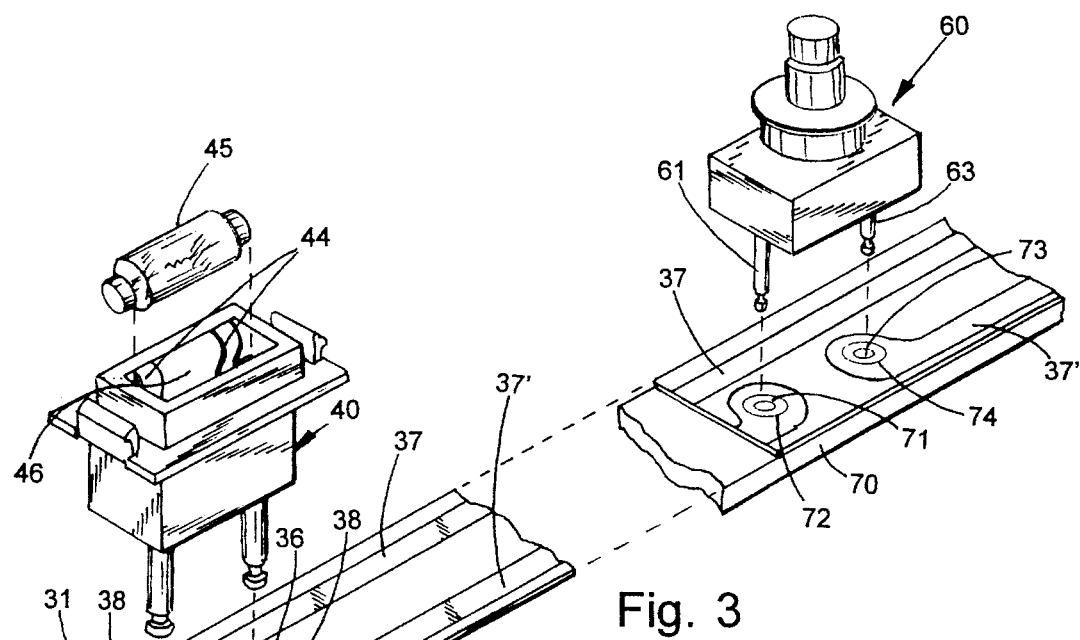
FIG. 3 is an enlarged, fragmentary, partially broken away and exploded view of circuit mounting structure of the present invention.
Figure 3:
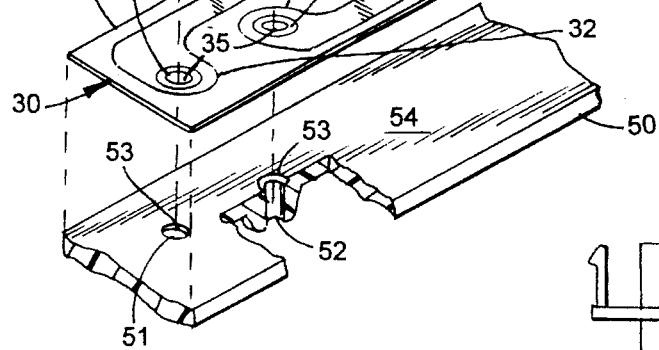
Figure 4:
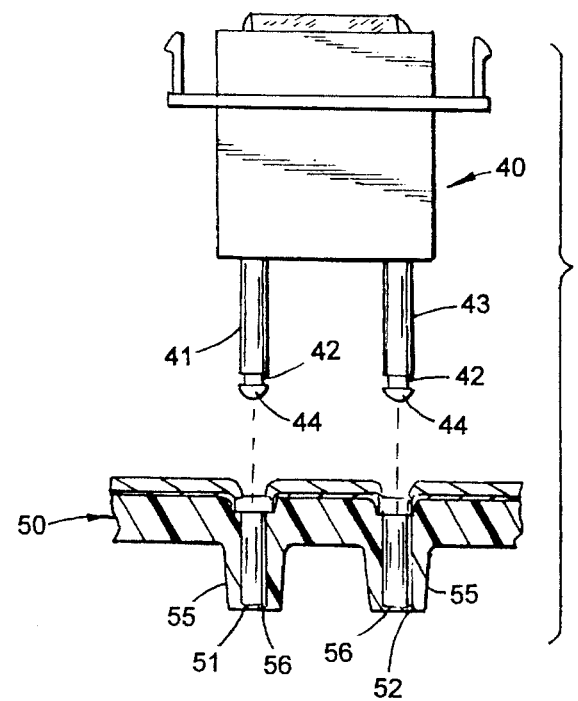
FIG. 4 is a greatly enlarged, exploded, side elevational view of a portion of the structure shown in FIG. 3, shown partially in cross section.
Figure 5:
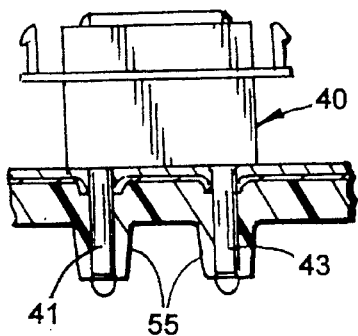
FIG. 5 is a reduced sized drawing of the structure of FIG. 4 shown in an assembled position.

Referring initially to FIG. 3, there is shown a substantially rigid insulative substrate 50 which has a thickness of at least about 0.120 inches and is made of any suitable insulative material, such as a polycarbonate or the like. The substrate, as noted in connection with FIGS. 1 and 2, may form the floor of the console housing or other vehicle accessory and includes, as best seen in FIGS. 4 and 5, a pair of apertures 51 and 52 which include a tapered or truncated conical entry surface 53 on the upper surface 54 of the substrate 50. The thickness and material of the substrate can be varied, although it is substantially rigid to allow contact pins to deform into seating engagement with an annular portion of the conductive material defining the terminals of flexible circuit 30 which is deformed into the opening of each of the apertures. The apertures 51, 52 also extend through a collar 55 underlying the plane of substrate 50 and terminate in inwardly projecting tips 56 (FIG. 4) which, when a component such as bulb socket 40 is inserted as seen in FIG. 5, initially deform and then snap-fit into annular grooves 42 near the tips of pin connectors 41 and 43. The pins 41 and 43 have rounded or otherwise tapered tips 44 to facilitate insertion of socket 40 into substrate 50.

The flexible circuit 30 includes a mylar substrate 31 having a thickness of approximately 0.10 inches and includes an electrical circuit thereon defined by conductive materials, such as copper, which can be formed over the entire surface of mylar substrate 31 and subsequently selectively etched away to define the conductors 37 and 37' (FIG. 3) and conductive terminals or pads 32 and 36. Alternatively, conductors 37, 37' and associated terminals can be printed on the mylar substrate using a conductive ink. In any event, the mylar substrate 31 includes the conductive terminals 32, 36 with central apertures 35 formed therethrough and each having a diameter slightly smaller than the diameter of aligned apertures 51, 52 and the outer diameter of pins 41, 43 such that insertion of the socket 40 through the mylar substrate and into the underlying, mechanically-supporting substrate 50 deforms the annular section 38 surrounding each of the apertures 35 (and which do not have an overlying insulative film thereon) into wiping engagement with the cylindrical sidewalls of pins 41, 43 and thereby establishing an increased electrical contact surface between the circuit conductors 37, 37' and the pins of socket 40. The conductors formed on substrate 30, other than the annular areas 38 of the various terminals, typically will be covered with an insulative film applied to the upper surface of substrate 30 in a conventional manner.

The tapered, annular surfaces 53 surrounding each of the apertures 52 in substrate 50 allow the deformation of annular terminal sections 38, as best seen in FIG. 4, to provide this significant contact area between the terminal pads 32, 36 of conductors 37 and the pins of lamp socket 40. Lamp socket 40 is of conventional construction and includes a body made of a suitable molded polymeric material, such as polycarbonate, including a lamp receiving socket 44 (FIG. 3) in a central upper opening 46 thereof for receiving a conventional cartridge-type lamp 45 therein.

The mylar flex circuit 30 can extend between the lamp socket 40 to an area remote therefrom, as illustrated in FIG. 3, to a switch terminal area in which a switch 60 of a single pole, single throw, push-push variety can be mounted for supplying operating power from conductor 37' through switch 30 to the terminal 36. The mylar circuit substrate 30 can therefore extend a considerable distance between lamp socket 40 and a switch 60 or other vehicle accessory and be supported at terminal segments only where a plug-in component is desired. For such purpose in connection with switch 60, a continuation of substrate 50 or a different substrate 70 of similar construction to that of substrate 50, shown in FIGS. 3–5, is employed and has apertures 71 and 73 of substantially the same configuration as that shown in FIGS. 4 and 5 for the lamp socket. Conductors 37 are integrally coupled by substrate 30 while supply conductor 37' is interrupted by contact terminals 72 and 74 which are electrically coupled by the selective operation of switch 60. For such purpose, switch 60 includes downwardly extending contact pins 61 and 63 which extend through apertures 71 and 73, respectively for electrically and mechanically coupling the switch to the flex circuit 30 and particularly to the terminals 72, 74 associated with conductor 37'. As can be appreciated, conductor 37 may constitute the vehicles ground conductor and may extend through other areas of the vehicle through a relatively thin ribbon of mylar flex circuit 30 while conductor 37' may be the vehicle's positive supply conductor. The flex circuit 30 may include several additional conductors as well depending upon the particular accessories with which the flexible circuit and underlying substrate are associated.

Figure 6:
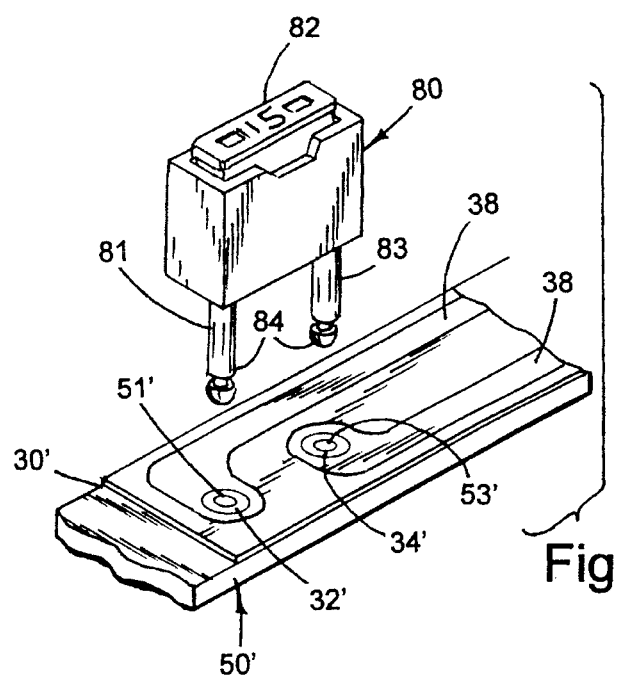
FIG. 6 is a fragmentary, perspective view in exploded form of an alternative embodiment of the present invention.
Figure 7:
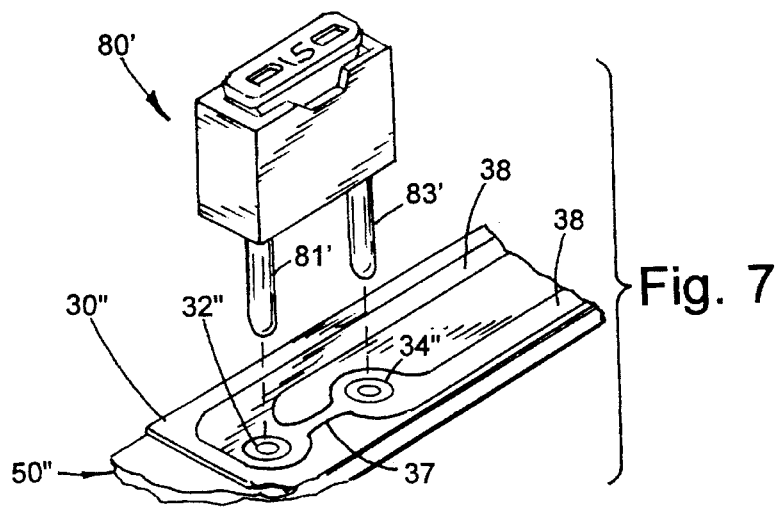
FIG. 7 is a fragmentary, perspective, exploded view of yet another embodiment of the present invention.

FIGS. 6 and 7 show alternative accessories with which a flexible circuit, such as that shown in FIGS. 1–5, can be employed. In FIG. 6, for example, a mechanical substrate 50', identical in construction to that of substrate 50, is shown and includes a flexible mylar substrate 30' of substantially identical construction to substrate 30. A pair of electrical terminals 32' and 34' interrupt circuit conductor 38 to define a fuse opening to which a fuse block 80 can be inserted. Fuse block 80 comprises a mounting member including electrical contact pins 81, 83 extending through apertures 51' and 53' of substrate 50' and the associated electrical contact terminals 32', 34' of flex circuit 30' to electrically couple the fuse socket 80 in series with electrical conductor 38. Pins 81 and 83 include annular recesses 84 spaced near the rounded ends of the pins to snap-lock fuse block 80 to circuit substrate 50'. Fuse block 80 includes a plug-in-type cartridge fuse 82 of, for example, 15 amp capacity as illustrated in the drawing figure.

In FIG. 7, a flexible circuit 30" is shown which includes an integral fuse link 39 bridging conductive terminals 32" and 34". Fuse link 39 is a thin strip of conductive material which is conventionally selected to carry a predetermined amperage between conductor segments of conductor 38 which is coupled to terminals 32" and 34". Upon excessive current, however, the fuse link 39 will vaporize interrupting the conductive path defined by conductors 38 interrupting the circuit. In such case, the terminal pads 32" and 34", which are of the same construction as the sockets shown in FIG. 1–6, are adapted to receive a fuse block 80' which is substantially identical to fuse block 80 with the exception that pins 81' and 83' do not include annular recesses 84 near their tips for locking the fuse block in the underlying substrate 50".

Typical dimensions for the structure shown in FIGS. 3–6 are 0.062 inches for the diameter of the contact pins with their locking grooves having a reduced diameter of 0.040 inches. The diameter of the apertures in the terminal pads for such pin diameter was 0.052 inches while the diameter of the apertures in the rigid substrate was 0.065 inches. The inwardly formed tab at the ends of the collars associated with the rigid substrate was 0.052 inches in diameter so as to snap-fit within the pin grooves.

Thus, although in most instances it is desirable to have the plug-in component mechanically locked to the supporting substrate 50 of the circuit component mounting system of the present invention, in some instances the locking feature is unnecessary. In all cases, however, the system of the present invention provides a relatively thin mylar flexible circuit with conductors formed thereon and which overlies a mechanical substrate having apertures aligned with apertures of contact terminals formed on the mylar circuit for receiving plug-in accessories. The mating surfaces of the mylar film, such as film 31 shown in FIG. 3, can be bonded to the upper surface 54 of the substrate 50 where the mylar flexible circuit 30 overlies such a substrate. The underlying substrate 50 may, however, only be aligned with the flex circuit 30 and the electrical component when installed provides a desired anchoring of the flex circuit to the supporting substrate. The electrical component mounting system of the present invention thereby provides a system by which electrical components can be readily installed at various locations within a vehicle and provide secure electrical and mechanical coupling of such components without the need for soldering or other bonding methods to assure electrical and mechanical connection.

In will become apparent to those skilled in the art that various modifications to the preferred embodiments described herein can be made without departing from the spirit and scope thereof as defined by the appended claims.

The embodiments of the invention in which an exclusive property or privilege is claimed are defined as follows.

1. An electrical component mounting system comprising:
    a substantially rigid substrate including at least one aperture formed therein for receiving a cylindrical electrical contact; and
    a circuit comprising a flexible substrate having conductive material on at least one surface to define a conductor and a terminal having a terminal aperture therethrough, said flexible substrate positioned on said substantially rigid substrate such that said terminal aperture aligns with said at least one aperture in said substantially rigid substrate, said terminal aperture having a diameter smaller than the diameter of said at least one aperture in said substantially rigid substrate such that as the cylindrical contact is extended through said flexible substrate, said conductive material deforms into said at least one aperture of said substantially rigid substrate to provide a contact surface engaging the cylindrical contact.

2. The system as defined in claim 1 wherein said substantially rigid substrate includes a first surface adjoining said flexible substrate and said at least one aperture in said substantially rigid substrate has a truncated conical entry formed adjacent said first surface.

3. The system as defined in claim 2 wherein said substantially rigid substrate includes a second surface opposite said front surface and further including a cylindrical collar extending from said second surface and through which said at least one aperture extends.

4. The system as defined in claim 3 wherein said collar includes an end remote from said second surface having an inwardly projecting tab for engaging a cylindrical contact inserted into said at lest one aperture.

5. The system as defined in claim 4 and further including an electrical component having a cylindrical contact with a diameter greater than the diameter of said terminal aperture and smaller than the diameter of said at least one aperture.

6. The system as defined in claim 5 wherein said contact includes an annular groove formed in spaced relationship near an end of said contact for receiving said tab.

7. An electrical component mounting system comprising:
    an electrical component including a conductor extending therefrom;
    a substantially rigid substrate including at least one aperture formed therein for receiving said conductor; and
    a flexible substrate having conductive material on at least one surface to define an electrical circuit including a terminal pad having a terminal aperture, said flexible substrate positioned on said substantially rigid substrate such that said terminal aperture aligns with said at least one aperture in said substantially rigid substrate, said terminal aperture having a diameter smaller than the diameter of said at least one aperture in said substantially rigid substrate such that when said conductor is extended through said flexible substrate, said conductive material surrounding said terminal aperture deforms into said at least one aperture of said substantially rigid substrate to provide a contact surface engaging said conductor.

8. The system as defined in claim 7 wherein said substantially rigid substrate includes means for lockably gripping said conductor once inserted into said at least one aperture.

9. The system as defined in claim 8 wherein said substantially rigid substrate includes a first surface adjoining said flexible substrate and said at least one aperture in said substantially rigid substrate has a truncated conical entry formed adjacent said first surface.

10. The system as defined in claim 9 wherein said substantially rigid substrate includes a second surface opposite said first surface and further including a cylindrical collar extending from said second surface and through which said at least one aperture extends.

11. The system as defined in claim 10 wherein said collar includes an end remote from said second surface having an inwardly projecting tab for engaging a conductor inserted into said at lest one aperture.

12. The system as defined in claim 11 wherein said conductor has a diameter greater than the diameter of said terminal aperture and smaller than the diameter of said at least one aperture.

13. The system as defined in claim 12 wherein said conductor includes an annular groove formed in spaced relationship near an end of said conductor for receiving said tab.

14. The system as defined in claim 7 wherein said flexible substrate includes at least two spaced-apart component mounting areas electrically coupled to each other and wherein each component mounting area includes a substantially rigid substrate having at least one aperture for receiving a conductor for a component to be mounted in each area.

15. A housing for a vehicle accessory including electrical components comprising:

a flexible substrate having conductive material on at least one surface to define an electrical circuit having at least one terminal pad with a terminal aperture having a predetermined dimension; and a rigid substrate defining a part of the housing which extends under said flexible substrate and includes at least one aperture aligned with said terminal aperture, said at least one aperture having a dimension greater than the dimension of said terminal aperture such that when a conductor of an electrical component is extended through said flexible substrate, said conductive material deforms into said at lest one aperture of said rigid substrate to provide a contact surface engaging the conductor.

16. The housing as defined in claim 15 and further including an electrical component having a conductor for mounting said component to said flexible substrate, said conductor having a diameter greater than the diameter of said terminal aperture and smaller than the diameter of said at least one aperture.

17. The housing as defined in claim 16 wherein said substantially rigid substrate includes a tab projecting into said at least one aperture for engaging a conductor inserted into said at lest one aperture.

18. The housing as defined in claim 17 wherein said conductor includes an annular groove formed in spaced relationship near an end thereof for receiving said tab.

19. The housing as defined in claim 18 wherein said substantially rigid substrate includes a first surface adjoining said flexible substrate and said at least one aperture in said substantially rigid substrate has a truncated conical entry formed adjacent said first surface.

20. A method of mounting electrical components in a vehicle accessory comprising the steps of:

providing a vehicle accessory having a substantially rigid substrate with at least one aperture formed therein for receiving a conductor of an electrical component;

positioning a circuit comprising a flexible substrate having conductive material on at least one surface to define a conductor and a terminal having a terminal aperture therethrough on said substantially rigid substrate such that said terminal aperture aligns with said at least one aperture in said substantially rigid substrate, said terminal aperture having a diameter smaller than the diameter of said at least one aperture in said substantially rigid substrate; and inserting the conductor of an electrical component through said terminal aperture of said flexible substrate such that said conductive material deforms into said at least one aperture of said substantially rigid substrate to provide a contact surface engaging the cylindrical contact.

21. The method as defined in claim 20 wherein said inserting step includes snap locking said conductor to said substantially rigid substrate.

* * * * *